US009171806B2

(12) United States Patent
Ortner

(10) Patent No.: US 9,171,806 B2
(45) Date of Patent: Oct. 27, 2015

(54) METHOD OF MAKING A SEMICONDUCTOR CHIP INCLUDING IDENTIFYING MARKS

(71) Applicant: Infineon Technologies AG, Neubiberg (DE)

(72) Inventor: Joerg Ortner, Drolbollach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/299,481

(22) Filed: Jun. 9, 2014

(65) Prior Publication Data

US 2014/0287566 A1 Sep. 25, 2014

Related U.S. Application Data

(62) Division of application No. 12/145,099, filed on Jun. 24, 2008, now Pat. No. 8,754,538.

(51) Int. Cl.
*H01L 21/76* (2006.01)
*H01L 23/544* (2006.01)
*H01L 21/26* (2006.01)

(52) U.S. Cl.
CPC .............. *H01L 23/544* (2013.01); *H01L 21/26* (2013.01); *H01L 2223/5448* (2013.01); *H01L 2223/54433* (2013.01)

(58) Field of Classification Search
CPC .............. H01L 23/544; H01L 2223/5448; H01L 223/54433; H01L 21/70
USPC .............. 257/618, 620, 622, 797, E23.114, 257/E21.532, E23.179; 438/14, 401, 460, 438/462, 975
See application file for complete search history.

(56) References Cited

U.S. PATENT DOCUMENTS

| | | | |
|---|---|---|---|
| 4,192,449 A | 3/1980 | Tippetts | |
| 4,322,626 A | 3/1982 | Kawashima | |
| 5,294,812 A | 3/1994 | Hashimoto et al. | |
| 5,350,715 A | 9/1994 | Lee | |
| 5,733,711 A | 3/1998 | Juengling | |
| 5,898,478 A | 4/1999 | Yim et al. | |
| 6,063,685 A | 5/2000 | Steffan et al. | |
| 6,124,598 A | 9/2000 | Takizawa | |
| 6,337,162 B1 | 1/2002 | Irie | |
| 6,724,096 B2 | 4/2004 | Werner et al. | |
| 7,211,453 B2 | 5/2007 | Sandstrom | |
| 7,220,606 B2 | 5/2007 | Matsunami | |
| 2002/0017708 A1 | 2/2002 | Takagi et al. | |
| 2006/0003234 A1 | 1/2006 | Woolaway et al. | |
| 2006/0064191 A1 | 3/2006 | Naya et al. | |
| 2007/0202664 A1 | 8/2007 | Aoki | |
| 2008/0083996 A1 | 4/2008 | Kudo | |
| 2009/0277004 A1 | 11/2009 | Kotani et al. | |

FOREIGN PATENT DOCUMENTS

| | | |
|---|---|---|
| EP | 1478022 | 11/2004 |
| JP | 410041210 | 2/1998 |
| JP | 2007287989 | 1/2007 |

OTHER PUBLICATIONS

Office Action mailed Oct. 15, 2009 in U.S. Appl. No. 12/145,099.
Final Office Action mailed Feb. 1, 2010 in U.S. Appl. No. 12/145,099.
Final Office Action mailed Oct. 1, 2010 in U.S. Appl. No. 12/145,099.

*Primary Examiner* — Mark A Laurenzi
(74) *Attorney, Agent, or Firm* — Dicke, Billig & Czaja, PLLC

(57) ABSTRACT

A semiconductor chip includes a first mark for identifying a position of the chip within an exposure field. The semiconductor chip includes a first matrix in a first layer of the chip and a second mark within the first matrix identifying a position of the exposure field on a wafer.

19 Claims, 7 Drawing Sheets

METHOD OF MAKING A SEMICONDUCTOR CHIP INCLUDING IDENTIFYING MARKS

CROSS-REFERENCE TO RELATED APPLICATIONS

This Utility Patent Application is a divisional application of U.S. Ser. No. 12/145,099, filed Jun. 24, 2008, which is incorporated herein by reference.

BACKGROUND

Typically, it is difficult to trace the origins of failed semiconductor chips that have been returned by customers. A failed semiconductor chip may be traced back to a defined number of lots, such as for example three lots, but rarely to one lot, to a wafer of a lot, or to a defined position on a wafer of a lot. As a result, the correlation of the failure with inline data obtained during the manufacturing process is hindered and an in depth root cause analysis of the failure is difficult. In addition, it is typically difficult to keep track of multiple semiconductor chip samples during product and technology development and during product and technology qualification (e.g., tracking of process splits, yield learning).

For these and other reasons, there is a need for the present invention.

SUMMARY

One embodiment provides a semiconductor chip. The semiconductor chip includes a first mark for identifying a position of the chip within an exposure field. The semiconductor chip includes a first matrix in a first layer of the chip and a second mark within the first matrix identifying a position of the exposure field on a wafer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
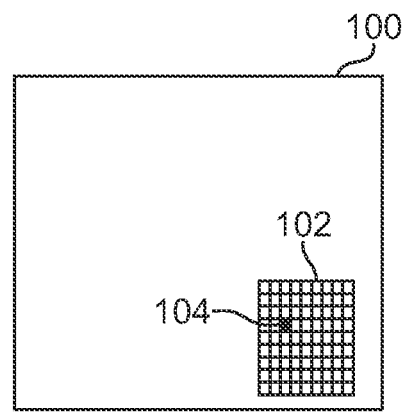
FIG. 1 is a diagram illustrating one embodiment of a semiconductor chip or die.

FIG. 1 is a diagram illustrating one embodiment of a semiconductor chip or die 100. Semiconductor chip 100 includes a chip device, such as a metal-oxide-semiconductor (MOS) chip or another suitable chip. Semiconductor chip 100 includes at least one reference structure or matrix 102. Semiconductor chip 100 also includes at least one marker 104 within matrix 102. In other embodiments, semiconductor chip 100 includes any suitable number of matrices and associated markers. Matrix 102 and marker 104 encode information for or about semiconductor chip 100, such as information for identifying and/or tracing semiconductor chip 100. The encoded information can include the position of semiconductor chip 102 on a wafer on which the semiconductor chip was fabricated, the wafer number, the lot number, or any other suitable information.

In one embodiment, matrix 102 and marker 104 are formed in a device layer of semiconductor chip 100, such as a polysilicon layer or another suitable layer. In one embodiment, matrix 102 is approximately 30 µm by 30 µm. In other embodiments, matrix 102 is larger or smaller than 30 µm by 30 µm. Based on the position of marker 104 within matrix 102, the encoded information is decoded and read out. In one embodiment, the information is read out optically by using a microscope or another suitable inspection tool.

Figure 2:
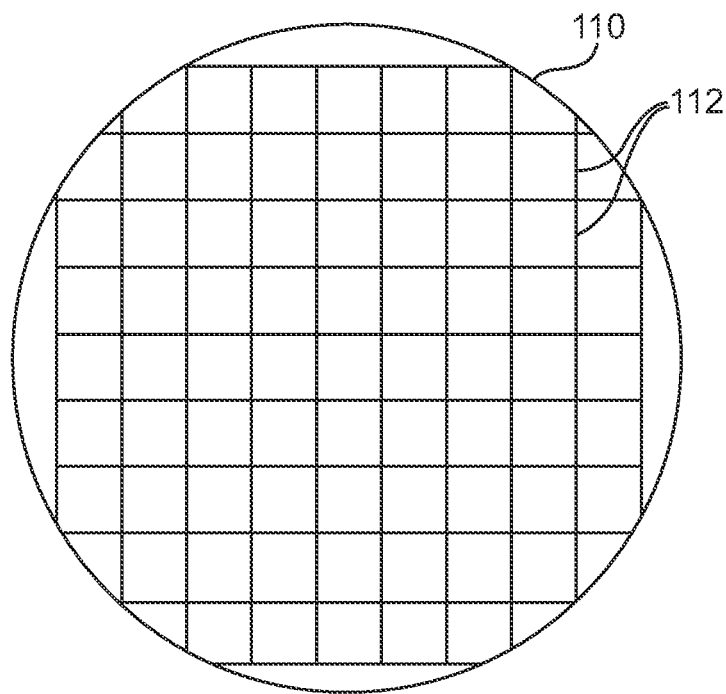
FIG. 2 is a diagram illustrating one embodiment of a wafer.

FIG. 2 is a diagram illustrating one embodiment of a wafer 110. Wafer 110 is used to fabricate a plurality of semiconductor chips 100. Wafer 110 includes a plurality of exposure fields as indicated for example at 112. A plurality of semiconductor chips 100 are formed within each exposure field 112. In one embodiment, a matrix 102 and a marker 104 of each semiconductor chip 100 indicates the exposure field 112 of wafer 110 in which each semiconductor chip 100 was formed. Wafer 110 can be any suitable size and can include any suitable number of exposure fields 112, with each exposure field 112 including any suitable number of die.

Figure 3:
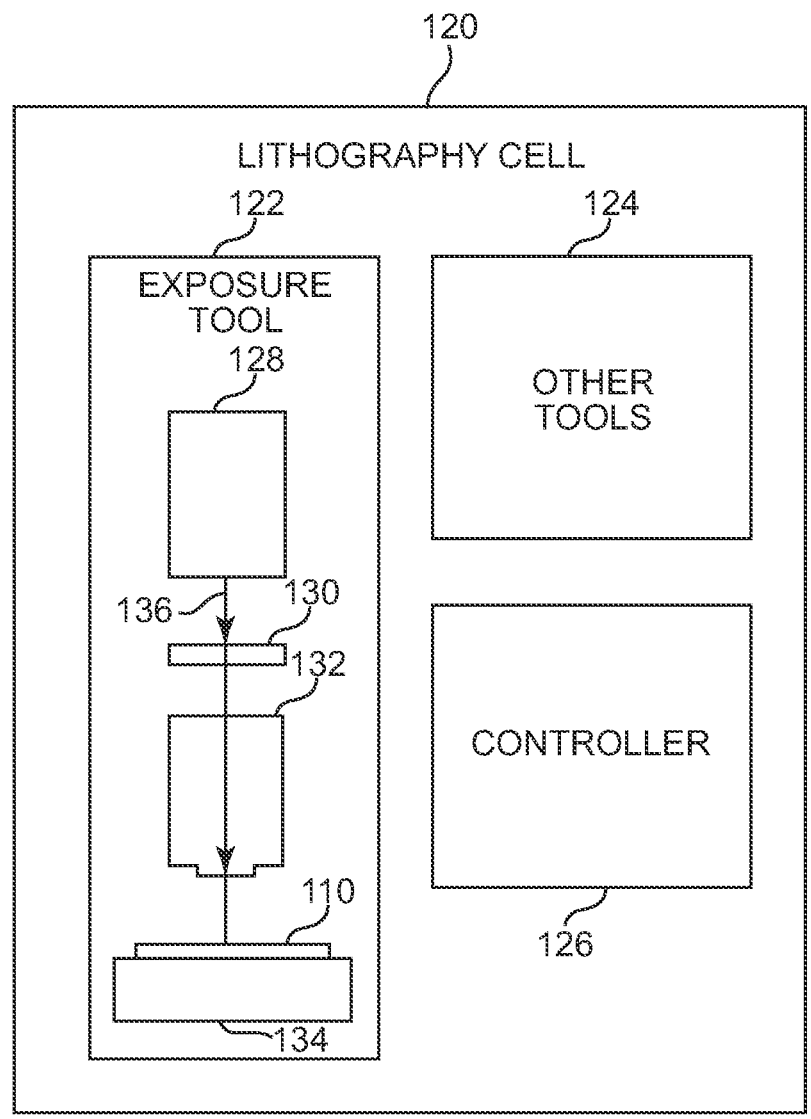
FIG. 3 is a diagram illustrating one embodiment of a lithography cell.

FIG. 3 is a diagram illustrating one embodiment of a lithography cell 120. Lithography cell 120 includes an exposure tool 122, other tools 124, such as a resist coating tool, a development processing tool, and/or other suitable tools for performing optical lithography on semiconductor wafers, and a controller 126. Controller 126 controls the operation of lithography cell 120 including the operation of exposure tool 122 and other tools 124 for fabricating semiconductor chips, such as semiconductor chip 100 previously described and illustrated with reference to FIG. 1.

Exposure tool 122 includes an illumination source 128 (e.g., laser, Hg lamp, or other suitable radiation emitting source), a reticle 130, a lens system 132, and a stage 134. In other embodiments, exposure tool 122 includes other suitable components. A wafer 110 is placed on stage 134 for exposure. In one embodiment, exposure tool 122 is used to form matrix 102 and marker 104 of each semiconductor chip 100. In one embodiment, exposure tool 122 is replaced with a nano imprint tool in which stencil masks are used to stamp or form matrix 102 and marker 104 of each semiconductor chip 100.

In one embodiment, exposure tool 122 is a stepper exposure tool in which exposure tool 122 exposes one exposure field 112 of wafer 110 at one time and then steps wafer 110 to a new location to repeat the exposure. In another embodiment, exposure tool 122 is a step and scan exposure tool, which combines both the scanning motion of a scanner (i.e., reticle 130 and wafer 110 are scanned passed the field of lens system 132 that projects the image of reticle 130 onto wafer 110) and the stepping motion of a stepper. Regardless of the method used, exposure tool 122 exposes each exposure field 112 of wafer 110.

Illumination source 128 provides filtered, conditioned, and aligned light to reticle 130 on optical path 136. Reticle 130 includes an image for projecting onto wafer 110 on stage 134. Reticle 130 is a glass or quartz plate containing information encoded as a variation in transmittance and/or phase about the features to be printed on wafer 110. In one embodiment for a first exposure, reticle 130 is a device layer reticle that includes images of matrices for defining a matrix 102 for each semiconductor chip to be formed within an exposure field 112. In another embodiment for a second exposure, reticle 130 is a marker reticle that includes images of markers for defining a marker 104 for each semiconductor chip to be formed within an exposure field 112. In another embodiment, the markers 104 are defined in a first exposure, and the matrices 102 are defined in a second exposure following the first exposure. The markers 104 and matrices 102 are defined in the same layer or in different layers of each semiconductor chip.

Lens system 132 focuses the light on optical path 136 from reticle 130 onto wafer 110 for writing on wafer 110. In one embodiment, lens system 132 includes a plurality of lens elements that can be adjusted to correct for focus, lens aberrations, and other parameters for maintaining critical dimension (CD) uniformity.

Stage 134 holds wafer 110 for exposure. Stage 134 and/or reticle 130 are positioned relative to lens system 132 for exposing exposure fields 112 of wafer 110 depending on whether exposure tool 122 is a stepper or step and scan exposure tool. In one embodiment, controller 126 controls the position of and/or adjusts illumination source 128, reticle 130, lens system 132, and stage 134 for exposing wafer 110. In one embodiment, controller 126 controls exposure tool 122 to expose wafer 110 using a device layer and matrix reticle for reticle 130 combined with a marker reticle for reticle 130 to define a matrix 102 and a marker 104, respectively, for each semiconductor chip 100 formed on wafer 110.

Figure 4:
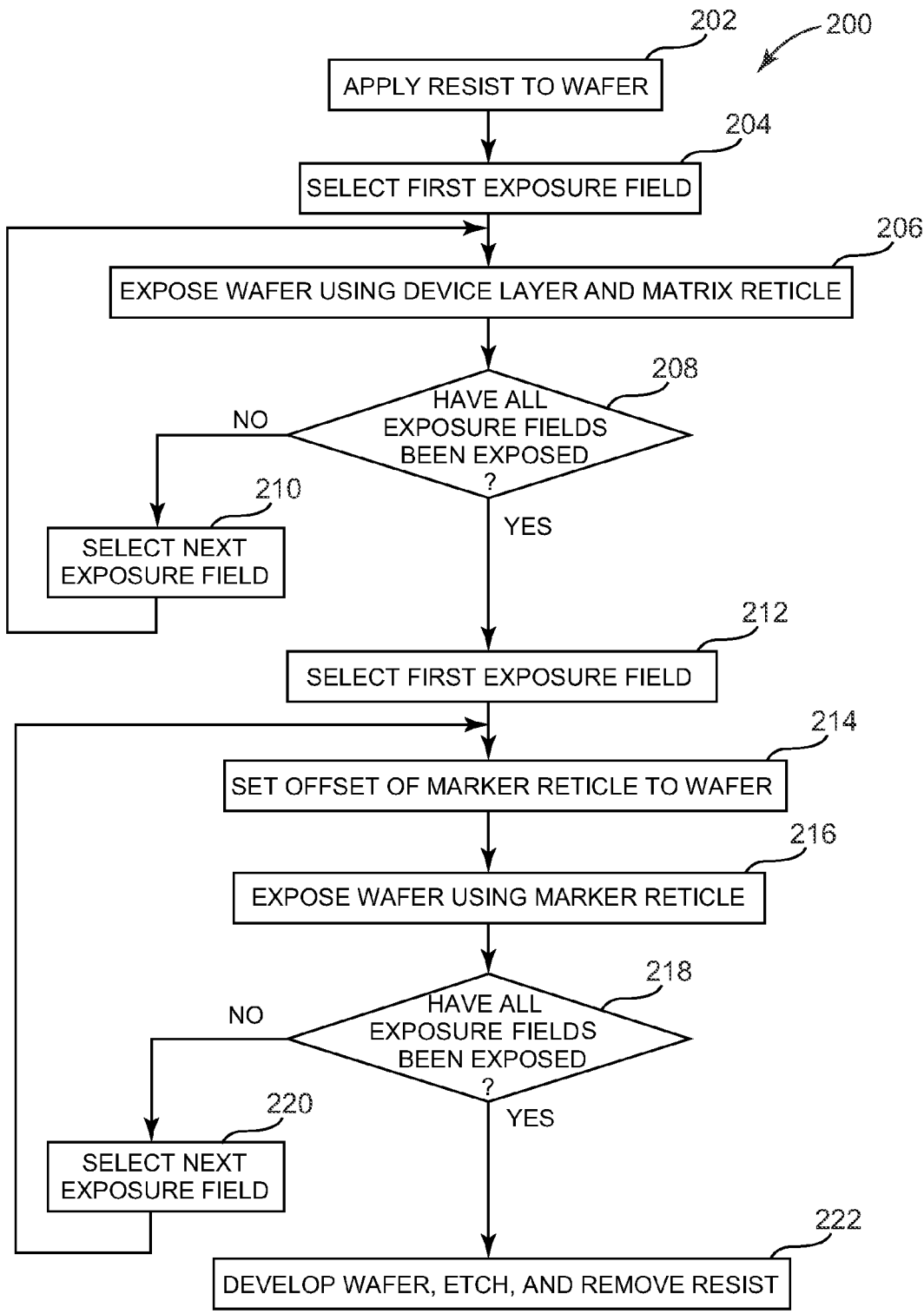
FIG. 4 is a flow diagram illustrating one embodiment of a method for encoding information on semiconductor dies.

FIG. 4 is a flow diagram illustrating one embodiment of a method 200 for encoding information on semiconductor dies. At 202, resist is applied to a wafer 110 by a resist coating tool. At 204, a first exposure field 112 of wafer 110 is selected. At 206, wafer 110 is exposed using a device layer and matrix reticle 130 by exposure tool 122 or another suitable tool. The device layer and matrix reticle includes any suitable number of images of matrices for defining matrices for encoding information for each semiconductor die. At 208, if all exposure fields 112 of wafer 110 have not been exposed, then at 210 the next exposure field 112 is selected and the exposure is repeated at 206. At 208, if all exposure fields 112 of wafer 110 have been exposed, then at 212 the first exposure field 112 is selected. In another embodiment, a mask is used and the entire wafer 110 is exposed using a single exposure to define matrices for encoding information for each semiconductor die.

At 214, a marker reticle 130 is offset relative to wafer 110 to mark all matrices for one information type in the selected exposure field 112. For example, in one embodiment, all matrices 102 within the selected exposure field 112 are marked with markers 104 to indicate the selected exposure field 112. In one embodiment, reticle 130 is adjusted to offset reticle 130 with respect to wafer 110. In another embodiment, stage 134 is adjusted to offset wafer 110 with respect to reticle 130. In another embodiment, both reticle 130 and stage 134 are adjusted to offset reticle 130 with respect to wafer 110. At 216, wafer 110 is exposed using the marker reticle 130 by exposure tool 122 or another suitable tool. At 218, if all exposure fields 112 of wafer 110 have not been exposed, then at 220 the next exposure field 112 is selected, the marker reticle is offset to the wafer at 214, and the exposure is repeated at 216.

At 218, if all exposure fields 112 of wafer 110 have been exposed, then at 222 wafer 110 is developed, etched, and the resist is removed. In this way, a device layer, matrix, and marker are fabricated on each die of wafer 110. In other embodiments, other suitable process flows are used to fabricate the device layer, matrix, and marker on each die of wafer 110. In other embodiments, any suitable number of matrices can be defined for each die with the device layer and marked by repeating blocks 212-220 for each matrix. In this case, a single marker reticle is used to define a marker within each matrix for all exposures. Each matrix adds one additional exposure. Therefore, if each die includes one matrix, one additional exposure in addition to the device layer exposure is used. If each die includes two matrices, two additional exposures in addition to the device layer exposure are used, and so on.

In one embodiment, each matrix includes only four rulers forming the border of the matrix. In one embodiment, several markers are included within a single matrix, where each marker encodes different information. In another embodiment, the markers within a single matrix include two or more different shapes where the shape indicates which information a marker is encoding.

Figure 5:
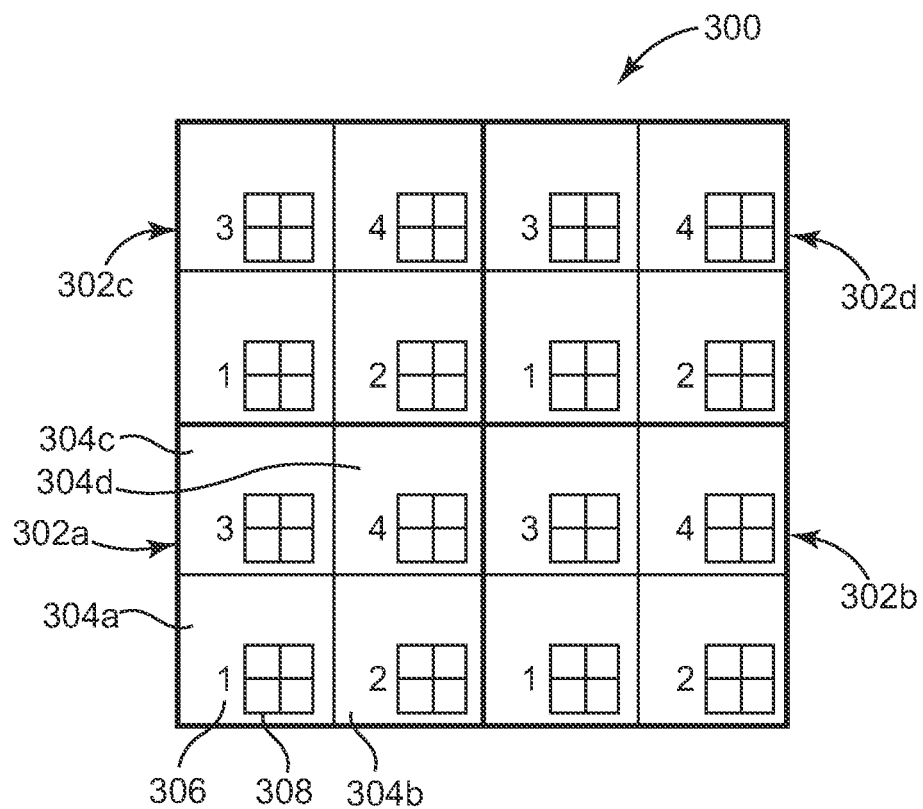
FIG. 5 is a diagram illustrating one embodiment of four exposure fields on a wafer.
Figure 6:
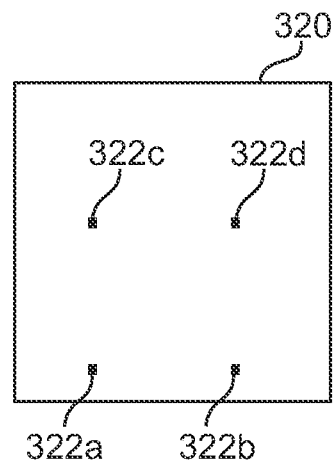
FIG. 6 is a diagram illustrating one embodiment of a marker reticle.
Figure 7:
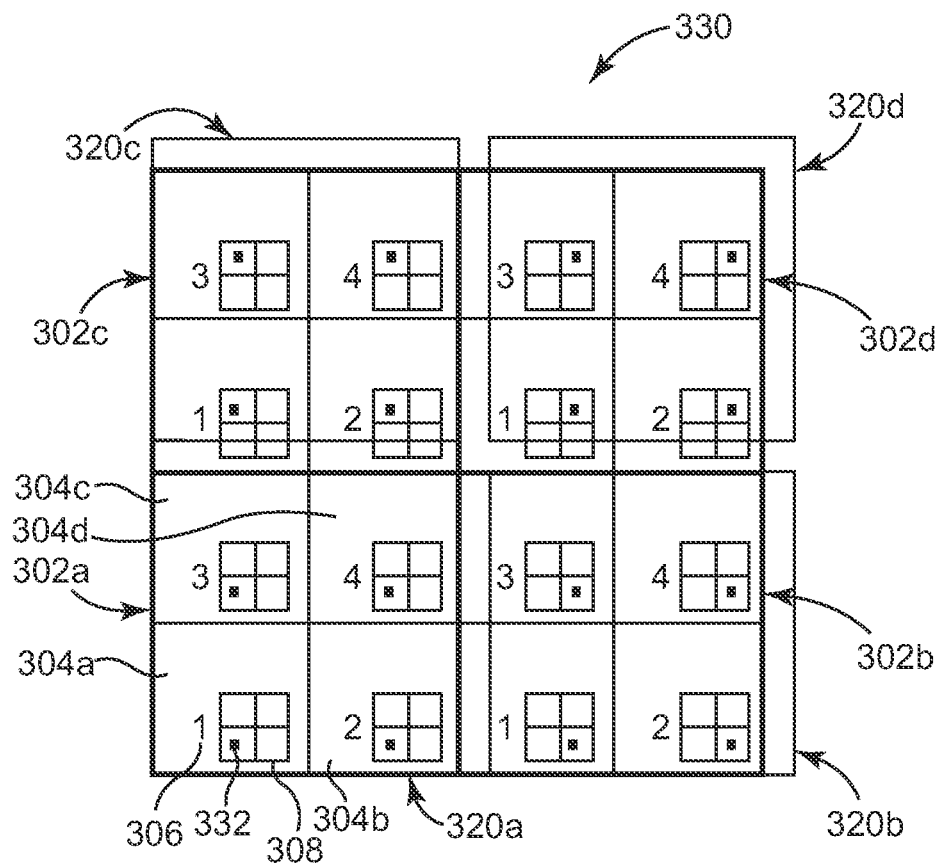
FIG. 7 is a diagram illustrating one embodiment of the four exposure fields after exposing them using the marker reticle.

The following FIGS. 5-7 illustrate one embodiment for marking individual die of a wafer for indicating the position of each die on the wafer. While FIGS. 5-7 illustrate four exposure fields with four die per exposure field for simplicity, in other embodiments any suitable number of exposure fields with any suitable number of die per exposure field can be used.

FIG. 5 is a diagram illustrating one embodiment of four exposure fields 302a-302d on a wafer 300. Each exposure field 302a-302d includes four die as indicated at 304a-304d. Each die includes a first mark or identifier 306 for indicating the position of the die within the exposure field. For example, the mark 306 for die 304a is "1", the mark 306 for die 304b is "2", the mark 306 for die 302c is "3", and the mark 306 for die 304c is "4". In other embodiments, other suitable marks or identifiers are used to indicate the position of the die within the exposure field, such as letters, shapes, or symbols. Each die also includes a matrix 308. Each mark 306 and each matrix 308 are formed in a device layer or another suitable layer of wafer 300 using a process as previously described and illustrated with reference to blocks 202-210 of FIG. 4. In another embodiment, the entire wafer 300 is exposed using a single exposure to provide first mark or identifier 306 for indicating the position of each die on wafer 300.

FIG. 6 is a diagram illustrating one embodiment of a marker reticle 320. In one embodiment, marker reticle 320 is used for reticle 130 in exposure tool 122 to provide a marker within each matrix 308. Marker reticle 320 includes one marker image 322a-322d for each die 304a-304d within each exposure field 302a-302d. Therefore, each matrix 308 within an exposure field 302a-302d is marked using a single exposure. For example, during a first exposure, marker image 322a defines a marker within matrix 308 of die 304a of exposure field 302a. Marker image 322b defines a marker within matrix 308 of die 304b of exposure field 302a. Marker image 322c defines a marker within matrix 308 of die 304c of exposure field 302a. Marker image 322d defines a marker within matrix 308 of die 304d of exposure field 302a. Likewise, during a second exposure, marker image 322a defines a marker within matrix 308 of die 304a of exposure field 302b, and so one.

FIG. 7 is a diagram illustrating one embodiment of the four exposure fields 302a-302d on a wafer 330 after exposing them using marker reticle 320. Each exposure field 302a-302d is exposed as previously described and illustrated with reference to blocks 212-220 of FIG. 4. For a first exposure, reticle 320 is not offset relative to exposure field 302a as indicated at 320a such that the lower left corner of each matrix 308 is marked with a marker 332. For a second exposure, reticle 320 is offset relative to exposure field 302b as indicated at 320b such that the lower right corner of each matrix 308 is marked with a marker 332. For a third exposure, reticle 320 is offset relative to exposure field 302c as indicated at 320c such that the upper left corner of each matrix 308 is marked with a marker 332. For a fourth exposure, reticle 320 is offset relative to exposure field 302d as indicated at 320d such that the upper right corner of each matrix 308 is marked with a marker 332. The markers for all the semiconductor chips within one exposure field are defined simultaneously, such that no masking blades are needed.

In this way, each die 304a-304d of each exposure field 302a-302d is uniquely marked to identify its position on wafer 330. For example, die 304a of exposure field 302a is marked with an exposure field internal number "1" for mark 306 and with a marker 332 in the lower left of matrix 308. Therefore, if the lower left corner of the wafer is designated as row one, column one, this die can be traced back to die one (i.e., die 304a) of the exposure field in row one, column one (i.e., exposure field 302a). Die 304d of exposure field 302b is marked with an exposure field internal number "4" for mark 306 and with a marker 332 in the lower right of matrix 308. Therefore, this die can be traced back to die four (i.e., die 304d) of the exposure field in row one, column two (i.e., exposure field 302b). Likewise, die 304b of exposure field 302c is marked with an exposure field internal number "2" for mark 306 and with a marker 332 in the upper left of matrix 308. Therefore, this die can be traced back to die two (i.e., die 304b) of the exposure field in row two, column one (i.e., exposure field 302c).

Figure 8:
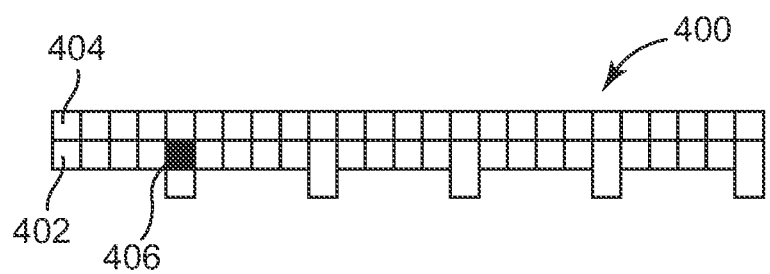
FIG. 8 is a diagram illustrating one embodiment of a matrix for encoding the wafer number.

FIG. 8 is a diagram illustrating one embodiment of a matrix 400 for encoding the wafer number. Matrix 400 includes two rows and 25 columns for identifying up to 50 wafers within a lot. In other embodiments, matrix 400 can include any suitable number of rows and columns for identifying any suitable number of wafers within a lot. In this embodiment, a marker in the first column (i.e., leftmost column), first row (i.e., bottom row) as indicated at 402 indicates wafer "1" and a marker in the first column, second row as indicated at 404 indicates wafer "26", such that marker 406 indicates wafer "5" in this embodiment. In one embodiment, matrix 400 and matrix 308 previously described and illustrated with reference to FIG. 7 are both included on each die to indicate the wafer number and position of the die on the wafer, respectively. Matrix 400 and marker 406 are formed using a method similar to method 200 previously described and illustrated with reference to FIG. 4.

Figure 9:
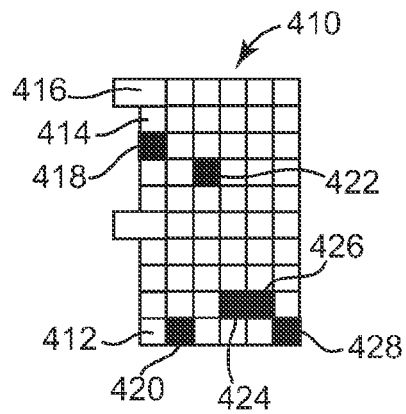
FIG. 9 is a diagram illustrating one embodiment of a matrix for encoding the lot number.

FIG. 9 is a diagram illustrating one embodiment of a matrix 410 for encoding the lot number. Matrix 410 includes ten rows and six columns for identifying a lot number including up to six digits. Each column of matrix 410 includes a marker to indicate one digit of the lot number. In other embodiments, matrix 410 can include any suitable number of rows and columns for identifying a lot number including any suitable number of digits. In this embodiment, a marker in the first row (i.e., bottom row) as indicated at 412 indicates a "1", a marker in the ninth row as indicated at 414 indicates a "9", and a marker in the tenth row as indicated at 416 indicates a "0".

Therefore, in this embodiment, marker 418 indicates an "8", marker 420 indicates a "1", marker 422 indicates a "7", marker 424 indicates a "2", marker 426 indicates a "2", and marker 428 indicates a "1" to provide a lot number equal to "817221". In one embodiment, matrix 410, matrix 400 previously described and illustrated with reference to FIG. 8, and/or matrix 308 previously described and illustrated with reference to FIG. 7 are included on each die to indicate the lot number, wafer number, and/or position of the die on the wafer, respectively. Matrix 410 and each marker 418-428 are formed using a method similar to method 200 previously described and illustrated with reference to FIG. 4. In this embodiment, however, a separate exposure is used to provide each marker 418-428 such that there are six exposures in addition to the device layer and matrix exposure per exposure field.

Figure 10:
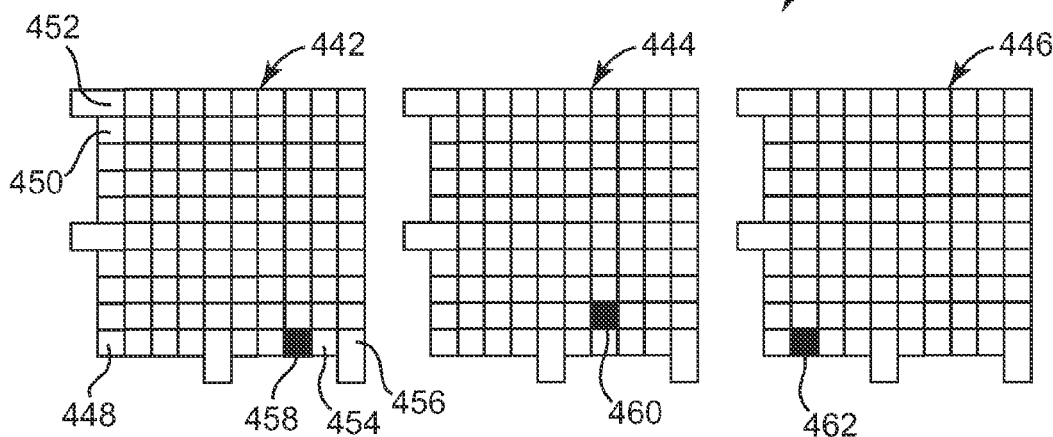
FIG. 10 is a diagram illustrating one embodiment of three matrices for encoding the lot number.

FIG. 10 is a diagram illustrating one embodiment of three matrices 440 for encoding the lot number. Each matrix 442, 444, and 446 includes ten rows and ten columns for identifying two digits of a lot number such that the combination of matrices 442, 444, and 446 identify a lot number including up to six digits. Each matrix 442, 444, and 446 includes a marker to indicate two digits. In other embodiments, additional matrices can be used for identifying a lot number including any suitable number of digits. In this embodiment, a marker in the first column (i.e., leftmost column), first row (i.e., bottom row) of a matrix 442, 444, and 446 as indicated at 448 indicates a "11", a marker in the first column, ninth row as indicated at 450 indicates a "19", a marker in the first column, tenth row as indicated at 452 indicates a "10", a marker in the ninth column, first row as indicated at 454 indicates a "91", and a marker in the tenth column, first row as indicated at 456 indicates a "01".

Therefore, in this embodiment, marker 458 of matrix 442 indicates an "81", marker 460 of matrix 444 indicates a "72", and marker 462 of matrix 446 indicates a "21" to provide a lot number equal to "817221". In one embodiment, matrices 440, matrix 400 previously described and illustrated with reference to FIG. 8, and/or matrix 308 previously described and illustrated with reference to FIG. 7 are included on each die to indicate the lot number, wafer number, and/or position of the die on the wafer, respectively. Matrices 440 and each marker 458-462 are formed using a method similar to method 200 previously described and illustrated with reference to FIG. 4. In this embodiment, however, a separate exposure is used to provide each marker 458-462 such that there are three exposures in addition to the device layer and matrix exposure per exposure field.

Figure 11:
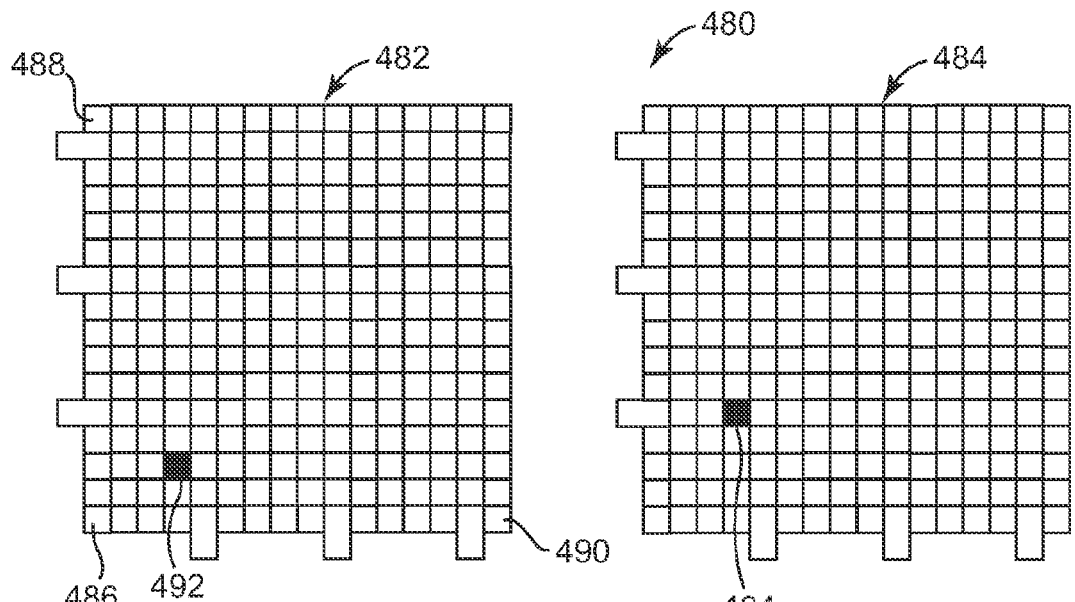
FIG. 11 is a diagram illustrating one embodiment of two matrices for encoding the lot number.

FIG. 11 is a diagram illustrating one embodiment of two matrices 480 for encoding the lot number. In this embodiment, the first number of the lot number, which in this example is not important information (e.g., the year), is excluded. The remaining five digits of the lot number are then converted to hexadecimal to provide a four digit hexadecimal representation of the lot number. For example, for the lot number "817221", the "8" is excluded and "17221" is converted to hexadecimal to provide "4345".

Each matrix 482 and 484 includes 16 rows and 16 columns for identifying two digits of a hexadecimal representation of a lot number such that the combination of matrices 482 and 484 provide a lot number including up to five digits. Each matrix 482 and 484 includes a marker to indicate two hexadecimal digits. In other embodiments, additional matrices can be used for identifying a lot number including any suitable number of digits. In this embodiment, a marker in the first column (i.e., leftmost column), first row (i.e., bottom row) of a matrix 482 and 484 as indicated at 486 indicates the hexadecimal number "11", a marker in the first column, 16th row as indicated at 488 indicates a "1F", and a marker in the 16th column, first row as indicated at 490 indicates a "F1".

Therefore, in this embodiment, marker 492 of matrix 482 indicates a "43" and marker 494 of matrix 484 indicates a "45" to provide a hexadecimal number equal to "4345" and a lot number equal to "17221". In one embodiment, matrices 480, matrix 400 previously described and illustrated with reference to FIG. 8, and/or matrix 308 previously described and illustrated with reference to FIG. 7 are included on each die to indicate the lot number, wafer number, and/or position of the die on the wafer, respectively. Matrices 480 and each marker 492 and 494 are formed using a method similar to method 200 previously described and illustrated with reference to FIG. 4. In this embodiment, however, a separate exposure is used to provide each marker 482 and 484 such that there are two exposures in addition to the device layer and matrix exposure per exposure field.

Figure 12:
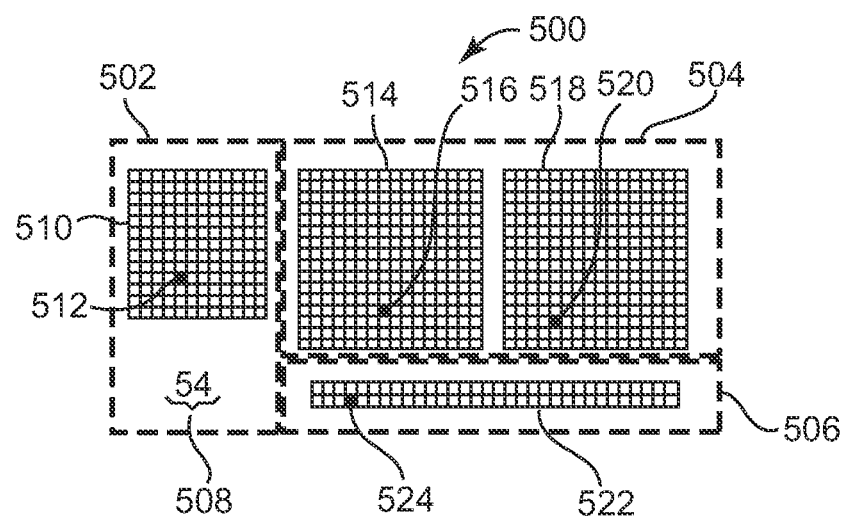
FIG. 12 is a diagram illustrating one embodiment of encoded information including the semiconductor chip position, the wafer number, and the lot number for a semiconductor chip.

FIG. 12 is a diagram illustrating one embodiment of encoded information 500 including the semiconductor chip position on a wafer, the wafer number, and the lot number for a semiconductor chip. Portion 502 of encoded information 500 includes an exposure field internal number 508, a matrix 510, and a marker 512 for indicating the position of the semiconductor chip on the wafer. In this embodiment, the exposure field internal number 508 is "54" indicating that the semiconductor chip is the 54th die in the exposure field. Marker 512 indicates that the semiconductor chip is in the exposure field at row four, column five on the wafer.

Portion 504 of encoded information 500 includes a lot number identified by matrices 514 and 518 and markers 516 and 520, respectively. In this embodiment, the lot number includes five digits encoded as a hexadecimal number. In this embodiment, marker 516 of matrix 514 indicates the hexadecimal number "84" and marker 520 of matrix 518 indicates the hexadecimal number "53" to provide the lot number "33875".

Portion 506 of encoded information 500 includes a wafer number identified by matrix 522 and marker 524. In this embodiment, marker 524 indicates wafer number "4". Matrices 510, 514, 518, and 522 and each marker 512, 516, 520, and 524, respectively, are formed using a method similar to method 200 previously described and illustrated with reference to FIG. 4. In this embodiment, however, a separate exposure is used to provide each marker 512, 516, 520, and 524 such that there are four exposures in addition to the device layer and matrix exposure per exposure field. The same marker reticle is used to provide each marker 512, 516, 520, and 524.

Figure 13:
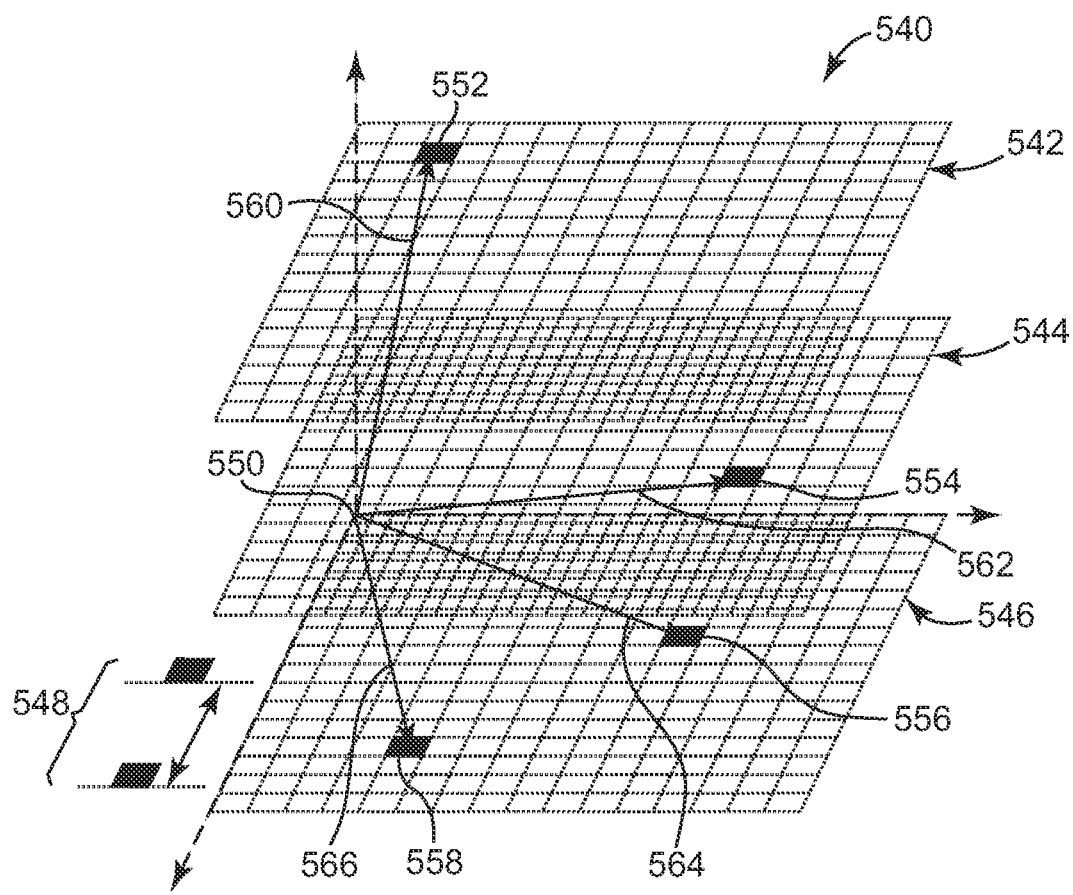
FIG. 13 is a diagram illustrating one embodiment of encoding information in multiple layers of a semiconductor chip.

FIG. 13 is a diagram illustrating one embodiment of encoding information 540 in multiple layers of a semiconductor chip. In this embodiment, a matrix 542 and a marker 552 are formed in a first layer of the semiconductor chip to encode two hexadecimal digits of a lot number. A matrix 544 and a marker 554 are formed in a second layer of the semiconductor chip to encode another two hexadecimal digits of the lot number. A third matrix 546 and a first marker 556 and a second marker 558 are formed in a third layer of the semiconductor chip to encode the wafer number and position of the semiconductor chip on the wafer, respectively. By stacking matrices 542, 544, and 546, the area used within any single layer of the semiconductor chip to encode information is reduced compared to the embodiment previously described and illustrated with reference to FIG. 12.

In another embodiment, matrices 542, 544, and 546 are excluded. In this embodiment, a reference structure 548 defining the pitch and a reference point 550 indicating the position 0/0 is formed in the semiconductor chip. Using the pitch defined by reference structure 548, vectors are measured from reference point 550 to each marker 552, 554, 556, and 558. Thus, the measurement of vector 560 from reference point 550 to marker 552 indicates two hexadecimal digits of a lot number. The measurement of vector 562 from reference point 550 to marker 554 indicates another two hexadecimal digits of the lot number. The measurement of vector 564 from reference point 550 to marker 556 indicates the wafer number. The measurement of vector 566 from reference point 550 to marker 558 indicates the position of the semiconductor chip on the wafer.

Embodiments provide encoded information on a semiconductor chip. The encoded information is optically readable and includes the position of the semiconductor chip on a wafer, the wafer number, the lot number, and/or any other suitable information. All semiconductor chips within an exposure field are marked simultaneously using a marker reticle including one marker image per semiconductor chip. The marker reticle is offset relative to the wafer for each exposure to encode the desired information on each die within an exposure field. Thus, each semiconductor chip is uniquely identified and traceable back to the fabrication process such that the correlation of a failure with inline data obtained during the manufacturing process and an in depth root cause analysis of the failure is possible. In addition, the unique identification of each semiconductor chip is useful for tracking of complex split experiments or yield learning during for example technology development.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a semiconductor chip, the method comprising:
   providing a wafer comprising a plurality of die;
   forming a first matrix within each die and a first mark identifying a position of each die within an exposure field; and
   forming a second mark within each first matrix identifying a position of the exposure field on the wafer.

2. The method of claim 1, wherein forming a first matrix within each die and a first mark identifying a position of each die within an exposure field comprises one exposure per exposure field, and
   wherein forming a second mark within each first matrix identifying a position of the exposure field on the wafer comprises one exposure per exposure field.

3. The method of claim 1, further comprising:
   forming a second matrix within each die; and
   forming a third mark within each second matrix encoding information for each die.

4. The method of claim 1, further comprising:
   forming a second matrix within each die; and
   forming a third mark within each second matrix identifying the wafer number.

5. The method of claim 1, further comprising:
   forming a second matrix within each die;
   forming a third matrix within each die;
   forming a third mark within each second matrix identifying a first portion of a lot number; and
   forming a fourth mark within each third matrix identifying a second portion of the lot number.

6. The method of claim 1, further comprising:
   forming a second matrix within each die;
   forming a third mark within each second matrix identifying the wafer number;
   forming a third matrix within each die;
   forming a fourth matrix within each die;
   forming a fourth mark within each third matrix identifying a first portion of a lot number; and
   forming a fifth mark within each fourth matrix identifying a second portion of the lot number.

7. A method for fabricating a semiconductor chip, the method comprising:
   providing a wafer comprising a plurality of die;
   forming a reference structure within each die and a first mark identifying a position of each die within an exposure field; and
   forming a second mark within each die identifying a position of the exposure field on the wafer based on a position of the second mark relative to a reference point of each die and based on the reference structure.

8. The method of claim 7, further comprising:
   forming a third mark within each die identifying the wafer number based on a position of the third mark relative to the reference point of each die and based on the reference structure.

9. The method of claim 7, further comprising:
   forming a third mark within each die identifying a first portion of a lot number based on a position of the third mark relative to the reference point of each die and based on the reference structure; and
   forming a fourth mark within each die identifying a second portion of a lot number based on a position of the fourth mark relative to the reference point of each die and based on the reference structure.

10. A method for fabricating a semiconductor chip, the method comprising:
    providing a first mark for identifying a position of the chip within an exposure field;
    forming a first matrix in a first layer of the chip; and
    forming a second mark within the first matrix identifying a position of the exposure field on a wafer.

11. The method of claim 10, further comprising:
    forming a second matrix in the first layer of the chip; and
    forming a third mark within the second matrix encoding information for each chip.

12. The method of claim 10, further comprising:
    forming a second matrix in a second layer of the chip; and
    forming a third mark within the second matrix identifying the wafer number.

13. The method of claim 10 comprising:
    forming a second matrix in the first layer of the chip; and
    forming a third mark within the second matrix identifying the wafer number.

14. The method of claim 10, further comprising:
    forming a second matrix in the first layer of the chip;
    forming a third matrix in the first layer of the chip;
    forming a third mark within the second matrix identifying a first portion of a lot number; and
    forming a fourth mark within each third matrix identifying a second portion of the lot number.

15. The method of claim 14, wherein the first mark is representative of a hexadecimal number.

16. The method of claim 10, further comprising:
    forming a second matrix in the first layer of the chip;
    forming a third mark within the second matrix identifying the wafer number;
    forming a third matrix in the first layer of the chip;
    forming a fourth matrix in the first layer of the chip;
    forming a fourth mark within the third matrix identifying a first portion of a lot number; and
    forming a fifth mark within the fourth matrix identifying a second portion of the lot number.

17. A method of making a semiconductor chip comprising:
    forming a first mark for identifying a position of the chip within an exposure field;
    forming a reference structure; and
    forming a second mark identifying a position of the exposure field on a wafer based on a position of the second mark relative to a reference point and based on the reference structure.

18. The method of claim 17, further comprising:
    a third mark identifying the wafer number based on a position of the third mark relative to the reference point and based on the reference structure.

19. The method of claim 17, further comprising:
    forming a third mark identifying a first portion of a lot number based on a position of the third mark relative to the reference point and based on the reference structure; and
    forming a fourth mark identifying a second portion of the lot number based on a position of the fourth mark relative to the reference point and based on the reference structure.

* * * * *